(12) United States Patent
Matsuda et al.

(10) Patent No.: US 7,794,578 B2
(45) Date of Patent: Sep. 14, 2010

(54) METHOD FOR PREPARING A CIRCUIT BOARD MATERIAL HAVING A CONDUCTIVE BASE AND A RESISTANCE LAYER

(75) Inventors: Akira Matsuda, Tochigi (JP); Yuuji Suzuki, Tochigi (JP); Hideo Otsuka, Tochigi (JP); Yuuki Kikuchi, Tochigi (JP); Sadao Matsumoto, Tochigi (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/719,020

(22) Filed: Nov. 24, 2003

(65) Prior Publication Data

US 2004/0144656 A1    Jul. 29, 2004

(30) Foreign Application Priority Data

Nov. 26, 2002   (JP)  ............................. 2002-341813

(51) Int. Cl.
    *C25D 3/56*    (2006.01)
(52) U.S. Cl. .................. 205/273; 205/125; 205/163; 205/167; 205/187; 205/258
(58) Field of Classification Search ................ 428/615, 428/621, 626, 650, 652, 675, 680, 681, 686, 428/931, 935; 205/125, 271, 272, 273, 920, 205/163, 167, 187, 258
    See application file for complete search history.

(56) References Cited

U.S. PATENT DOCUMENTS

| 3,691,007 A | 9/1972 | Pavlou ........................ 161/213 |
| 3,743,583 A | 7/1973 | Castonguay .................. 204/27 |
| 3,808,576 A | 4/1974 | Castonguay et al. ........ 338/309 |
| 3,857,683 A | 12/1974 | Castonguay ................. 29/195 |
| 3,865,702 A | 2/1975 | Immel et al. .................... 204/49 |
| 3,878,006 A | 4/1975 | Rice ................................. 156/3 |
| 4,808,967 A | 2/1989 | Rice et al. .................... 338/309 |
| 4,888,574 A * | 12/1989 | Rice et al. .................... 205/920 |
| 4,892,776 A | 1/1990 | Rice ............................. 428/209 |
| 5,049,221 A | 9/1991 | Wada et al. .................. 156/151 |
| 5,336,391 A | 8/1994 | Rice ............................ 205/152 |
| 5,689,227 A | 11/1997 | Nguyen et al. ............... 338/308 |
| 5,779,873 A * | 7/1998 | Law et al. .................... 205/271 |
| 5,863,407 A | 1/1999 | Kiyokawa |
| 5,961,808 A * | 10/1999 | Kiyokawa .................... 205/159 |
| 5,985,124 A | 11/1999 | Yoda et al. ................... 205/118 |
| 2002/0170827 A1 | 11/2002 | Furuya |

FOREIGN PATENT DOCUMENTS

| CN | 1037039 C | | 1/1998 |
| CN | 1374827 A | | 10/2002 |
| JP | 48-73762 | | 10/1973 |
| JP | 54-72468 | | 6/1979 |
| JP | 59-050190 | * | 3/1984 |
| JP | 59-50190 | * | 3/1984 |
| JP | 63-500133 | | 1/1988 |
| SU | 699037 A1 | | 11/1979 |
| TW | 419530 | | 1/2001 |
| WO | WO 01/63016 | * | 8/2001 |

OTHER PUBLICATIONS

Kazanovtse Y. I. et al. "Deposition of nickel-phosphorus alloys—using electrolyte contg. nickel sulphamate, nickel chloride, orthophosphoric acid, phosphorous acid, zinc phosphate", WPI World Patent Information Derwent, Derwent, GB, vol. 29, Nov. 28, 1979.*

Kazanovtse Y. I. et al. *"Deposition of nickel-phosphorus alloys—using electrolyte contg. nickel sulphamate, nickel chloride, orthophosphoric acid, phosphorous acid, zinc phosphate"*, WPI World Patent Information Derwent, Derwent, GB, vol. 29, Nov. 28, 1979 (abstract only).

European Search Report, European Patent Office, Application No. EP 03027308, Apr. 6, 2004.

Chinese Office Action dated Mar. 28, 2008 of CN2003101179523.
Taiwanese Office Action on TW Application No. 92131763 dated Oct. 29, 2009.

* cited by examiner

*Primary Examiner*—Cathy Lam
(74) *Attorney, Agent, or Firm*—Westerman, Hattori, Daniels & Adrian, LLP

(57) ABSTRACT

A plating bath, able to form a resistance layer with a uniform thickness distribution on the roughened surface of a conductive base, including nickel ions and sulfamic acid or its salt as essential components and at least one of phosphoric acid, phosphorous acid, hypophosphorous acid, and salts of the same; a conductive base having a thin resistance layer with a stable resistance, and a resistance circuit board material using the same.

7 Claims, No Drawings

METHOD FOR PREPARING A CIRCUIT BOARD MATERIAL HAVING A CONDUCTIVE BASE AND A RESISTANCE LAYER

BACKGROUND OF THE INVENTION

1. Field of the Invention

The present invention relates to a circuit board material with a resistance layer useful for the production of a printed resistance circuit board, more particularly relates to a plating bath for forming a resistance layer on a conductive base forming that circuit board material with a resistance layer by plating and a plating method of the same.

2. Description of the Related Art

A printed circuit board material including resistors (hereinafter called a "resistance circuit board material") is generally provided in the form of a multilayer body of an insulating substrate and a conductive base with a resistance layer comprised of a resistance layer bonded with that substrate and copper foil or another high conductivity base bonded with that resistance layer.

A printed resistance circuit using a resistance circuit board material is produced by the subtractive method giving insulating regions from which all of the resistance layer and conductive base on the insulating substrate are removed, resistance regions from which the high conductivity base is removed, and all remaining conductive regions in accordance with the targeted pattern of the circuit (mask etching).

In the past, as the material forming the resistance layer, a carbon-based resistance material was generally used. As other metal thin films used, nickel electroplating including phosphorus (Japanese Patent Publication (A) No. 48-73762 and Japanese National Publication No. 63-500133), nickel electroplating including tin (Japanese Patent Publication (A) No. 54-72468), etc. have been proposed. With these types of metal thin resistance layers, however, while it is possible to obtain a film with a high sheet resistance by reducing the thickness, in general, if the thickness is reduced, the uniformity of the metal film is lost and a constant sheet resistance cannot be obtained, so there are limits to the reduction of thickness.

That is, in the production of a conductive base with a resistance layer, a thin resistance layer is formed on a conductive base by electroplating, but to raise the bonding strength of the conductive base with a resistance layer with the insulating substrate, the surface of the conductive base is roughened, then is plated with the Ni—P etc. serving as resistance layer. With this method, however, since the resistance layer is present on the rough surface of the conductive base, in particular roughened by fine roughened particles, even right after plating, the uniformity of thickness of the plating is poor and the sheet resistance lacks stability.

Further, dissolution of part of the resistance layer cannot be avoided since the layer of the conductive base is etched away when used as a resistance circuit board material. Further, if there is unevenness in thickness in the Ni—P plating resistance layer, there is the defect that even part of the resistance layer is sacrificed in order to completely remove the layer of the conductive base. It was extremely difficult to stably leave resistors and produce a printed resistance circuit board. Further, when producing a multilayer printed resistance circuit board, the printed resistance circuit board is hot pressed. There are therefore the defects that at this time, cracks occur in parts of only the resistance layer (parts where conductive base is etched away), the resistance increases, or sometimes the circuit becomes open.

In forming a resistance layer by such Ni—P alloy plating of the above patent publications, nickel ions, phosphorous acid ions, and phosphoric acid ions are essential. A plating bath for forming the resistance layer of the former patent publication also includes sulfuric acid ions and chlorine ions. A conductive base with a resistance layer obtained by plating a conductive base by such a bath suffers from uneven color at the time of plating and variations in the plating layer microscopically. In a wide material used at the time of mass production (for example, having a width greater than 300 mm), variation easily occurs in the plating thickness and phosphorus content in the width direction and the fluctuation in resistance of the resistance circuit becomes greater.

In the case of a resistance layer made of an Ni—Sn alloy, tin oxides or hydroxides remain on the insulating substrate when etching the resistance layer when forming insulation regions (dissolving the Ni—Sn) and the problem arises of poor insulation. Further, Ni—Cr, Ni—Cr—Al—Si, etc. formed by vapor deposition have been developed for the same purposes, but problems of cost and productivity and also problems of a low bonding strength with the insulating material have been pointed out.

SUMMARY OF THE INVENTION

An object of the present invention is to provide a plating bath enabling the formation of a resistance film by a uniform thickness distribution even on a rough surface of a roughened conductive base, a conductive base with a resistance layer having a stable resistance thin resistance layer, and a resistance circuit board material using the same.

According to a first aspect of the invention, there is provided a plating bath for formation of a thin resistance layer on a surface of a conductive base, wherein the plating bath includes nickel ions and sulfamic acid or its salt as essential components and at least one of phosphoric acid, phosphorous acid, hypophosphorous acid, and salts of the same.

Preferably, the plating bath further includes at least one of sulfuric acid, hydrochloric acid, and salts of the same.

Preferably, the pH is made not more than 6.

According to a second aspect of the invention, there is provided a method of formation of a thin resistance layer in an above plating bath wherein the thin resistance layer is formed in a range of bath temperature of 30 to 80° C.

Furthermore, there is provided a method of formation of a thin resistance layer in an above plating bath wherein the thin resistance layer is formed in a range of current density of 1 to 30 A/dm$^2$.

Furthermore, there is provided a method of formation of a thin resistance layer in an above plating bath wherein the thin resistance layer is formed using an insoluble anode.

According to a third aspect of the invention, there is provided a conductive base with a resistance layer wherein a thin resistance layer comprised of an Ni alloy layer containing 2 to 30 wt % of phosphorus is formed on the surface of the conductive base by a method of formation of a thin resistance layer in an above plating bath in a range of bath temperature of 30 to 80° C.

Furthermore, there is provided a conductive base with a resistance layer wherein a thin resistance layer comprised of an Ni alloy layer containing 2 to 30 wt % of phosphorus is formed on the surface of the conductive base by a method of formation of a thin resistance layer in an above plating bath in a range of current density of 1 to 30 A/dm$^2$.

Furthermore, there is provided a conductive base with a resistance layer wherein a thin resistance layer comprised of an Ni alloy layer containing 2 to 30 wt % of phosphorus is formed on the surface of the conductive base by a method of formation of a thin resistance layer in an above plating bath using an insoluble anode.

Preferably, at least the surface on which the resistance layer is formed has a roughness Rz of not more than 3.5 μm.

According to a fourth aspect of the invention, there is provided a circuit board material with a resistance layer comprised of an insulating substrate to at least one surface of which an above conductive base with a resistance layer is adhered with the resistance layer at the base at the inside.

DESCRIPTION OF THE PREFERRED EMBODIMENTS

Preferred embodiments of the present invention will be described in detail below while referring to the attached figures.

In the present invention, a bath comprised of mostly sulfamic acid is selected so as to obtain microscopically and macroscopically uniform electrodeposition of Ni—P. Further, the processability by hot pressing etc. also becomes better compared with a conventional plating bath.

The plating bath and plating conditions for plating a resistance layer on a conductive base according to the present invention are as follows: The concentration of nickel and the concentration of nickel sulfamate should be ranges ordinarily used in sulfamic acid plating baths. The range of the nickel sulfamate is preferably 300 to 600 g/L.

The phosphoric acid, phosphorous acid, and hypophosphorous acid to be gradually added to the plating bath may be added as they are or may be added in the form of sodium salts instead. As the concentration of phosphorus at this time, a range of 20 to 150 g/L is preferable. Considering however the prevention of crystallization at the time of a drop in solution temperature such as when the facility is not being operated, a range of 20 to 100 g/L is preferable.

The plating bath can be adjusted in pH by using sodium or another salt. Further, NaOH or another alkali or sulfamic acid may be added to adjust the pH. The higher the pH, the worse the uniformity of the plating film, so the pH is preferably kept to not more than 6. Further, below 4, there is less fluctuation of the pH—making this more preferable. The plating bath may also contain boric acid or another pH buffer to increase the pH stability and stabilize the film composition and current efficiency more.

By adding sulfuric acid, hydrochloric acid, or salts of the same to the plating bath, it is possible to improve the smoothness and processability of the plating film. The concentration is suitably 0.1 to 30 g/L. If over this, the hardness and internal stress rise.

A bath temperature of 30 to 80° C. is preferable in that a good current efficiency and stable phosphorus content are exhibited. If over 70° C., however, the sulfamic acid gradually is hydrolyzed, so the temperature is more preferably not more than 70° C. from the viewpoint of the bath lifetime. Further, the current efficiency drops the lower the temperature, so a temperature of at least 45° C. is preferable.

The current density should be 1 to 30 A/dm$^2$. If over this, a drop in the current efficiency or a deterioration of the smoothness may easily occur.

As the anode, it is possible to use a nickel, Ni—P alloy, or another soluble anode. However, a soluble anode is dissolved and consumed with long term plating resulting in a change in the distance from the cathode (conductive base) and a deterioration of the macroscopic plating thickness distribution. The concentration of nickel in the bath increases due to the difference of current efficiency between the anode and cathode. Therefore, the solution has to be drained and the cost rises. Due to these reasons, an insoluble anode is preferably used. Note that if using an insoluble anode, the nickel in the plating bath is reduced, so it is necessary to replenish the nickel. For this, it is preferable to add nickel carbonate or another nickel salt.

Further, if using an insoluble anode, hypophosphorous acid changes to phosphorous acid or phosphoric acid due to an electrolytic reaction, so for stabilization of the deposited film, phosphorous acid or phosphoric acid is superior to hypophosphorous acid.

In the film of the resistance layer formed, if the phosphorus content is 2 to 30 wt %, a high resistance is obtained and the etchability is good as well. In particular, if 8 to 18 wt %, the resistance and etchability are stabilized and there is less fluctuation in resistance due to dissolution after etching of the conductive base (for example, copper film). The thickness should be in the range of 1 nm to 1000 nm. It is possible adjust the resistance to the desired value by the phosphorus content and layer thickness. Further, as the alloy components other than nickel and phosphorus, it is also possible to include copper, cobalt, or other elements. Note that after forming the resistance layer, the surface may be treated by zinc, chromate, silane, etc.

Further, if the surface of the conductive base before plating is too rough, the surface roughness of the resistance layer formed over it will become great as well, it will become difficult to uniformly bond the Ni—P layer, and fluctuations will easily occur in the plating thickness. Further, when used as a resistance circuit board material, during the hot pressing after etching of the substrate material, stress easily concentrates due to the roughness and cracking easily occurs, so the surface roughness Rz of the conductive base before plating is preferably not more than 3.5 μm, particularly preferably not more than 2.5 μm from the viewpoint of processability.

An embodiment of the method of production of a resistance circuit board material according to the present invention will be explained next.

First, a high conductivity base, for example, copper foil, is covered on one entire side by a masking adhesive sheet, ink, etc. Next, an Ni—P alloy plating layer is formed as a resistance layer on the other surface. Thereafter, the masking adhesive sheet etc. is peeled off and an insulating substrate is bonded to the resistance layer side by hot pressing, an adhesive, etc. A printed resistance circuit board is formed from this resistance circuit board material by forming insulation regions (where all of the resistance layer and conductive base on the insulating substrate are dissolved away), resistance regions (where the high conductivity base is dissolved away), and conductor regions (remainder) by for example the dissolution method. After formation of the circuit, the resistance regions and conductor regions are formed with a protective layer by a liquid or film-like cover coat.

In the above processing, as the etching solution, it is possible to use a known etching solution. For example, in the case of copper foil, ferric chloride, cupric chloride, ammonium persulfate, a chromic acid-sulfuric acid mixture, an ammonia chelate-based etching solution, etc. may be used. The etching solution for an Ni—P resistance layer may be a copper sulfate-sulfuric acid solution, ferric sulfate-sulfuric acid solution, ammonium persulfate-sulfuric acid solution, or other known solution.

As the conductive material forming the conductive base with a resistance layer of the present invention, copper foil or copper alloy film, aluminum foil, aluminum alloy foil, iron alloy foil, or other foil having a high conductivity formed by electrolysis or rolling is preferable. Copper foil is the best from the viewpoint of etching or recycling.

As the insulating substrate, epoxy resin, polyester, polyimide, polyamide imide, or composites of these with glass cloth, phenol resin-paper, epoxy resin-paper, and other laminates, etc. may be used. Further, the above insulating laminates, sheets, or films having aluminum or iron sheets bonded to them as heat sinks (bonded on opposite sides to surfaces where resistance layers are provided) may also be used. Further, as the insulating substrate, a ceramic sheet, glass sheet, or other inorganic material using an epoxy resin, polyester, polyurethane, polyamide imide, polyimide, and rubber or other resins or rubbers as an adhesive layer may be used.

In the above explanation, for simplification., reference was made to a structure comprised of an insulating substrate on one surface of which a resistance layer and conductive base are bonded, but the resistance circuit board material according to the present invention can be improved or changed structurally. For example, a structure comprised of an insulating substrate on both surfaces of which a resistance layer and conductive base are bonded or a structure comprised of an insulating substrate on one surface of which a resistance layer and conductive layer are bonded and on the other surface of which a high conductivity layer (for formation of conductors and/or electrodes by etching) is bonded are also included.

Further, the resistance layer may also be formed not only by providing it on one roughened surface of the conductive base, but also on a nonroughened surface or on two roughened or nonroughened surfaces in accordance with the objective of use. The above explanation was made for the purpose of generally explaining the present invention and has no limitative meaning at all. The scope of the present invention can be judged best by reference to the claims.

The present invention relates to a resistance circuit board material, a conductive base with a resistance layer to be bonded to an insulating substrate forming that resistance circuit board material, and a plating bath for forming a resistance layer on the surface of the conductive base forming that conductive base with a resistance layer. In general, a printed circuit board is comprised of three layers: an insulating substrate, an electrical resistance layer, and a conductive layer, but three or more layers are also included in the present invention. Further, a resistance circuit board material obtained by stacking a number of these is of course also included.

Below, the present invention will be explained in further detail with reference to examples.

EXAMPLES

The following conductive base was pretreated by immersion in 1:1 hydrochloric acid (35%) water at ordinary temperature for 3 minutes, then was plated with a resistance layer. The unevenness of plating appearance was evaluated and the amount of nickel electrodeposition (mg/dm$^2$) as the plating thickness, the content (%) of phosphorus, and the resistance in a 1 mm□ after formation of the circuit were measured. The results are shown in Table 1. Note that the pH of the plating bath was adjusted using sulfamic acid and NaOH in the examples and using NaOH in the comparative examples.

Example 1

A conductive base was masked with a resistance layer made of roughened electrolytic copper foil having a thickness of 18 μm and a matte surface of a roughness Rz of 2.1 μm. The shiny surface was completely masked, while the matte surface was masked leaving 10×10 cm$^2$ open. As the anode, a platinum-plated titanium sheet having a surface area of 1.5 dm$^2$ was used. The matte surface was plated in the following bath.

| | |
|---|---|
| Nickel sulfamate: | 350 g/L |
| $H_3BO_3$: | 35 g/L |
| $H_3PO_4$: | 50 g/L |
| $H_3PO_3$: | 40 g/L |
| Bath temperature: | 65° C. |
| Current density: | 15 A/dm$^2$ |
| Time: | 30 sec |
| pH: | 1.0 |

Example 2

Plating was performed by the following bath in the same way as Example 1:

| | |
|---|---|
| Nickel sulfamate: | 350 g/L |
| $NiCl_2 \cdot 6H_2O$: | 45 g/L |
| $H_3PO_4$: | 50 g/L |
| $H_3PO_2$: | 40 g/L |
| Bath temperature: | 65° C. |
| Current density: | 5 A/dm$^2$ |
| Time: | 30 sec |
| pH: | 1.3 |

Example 3

Plating was performed by the following bath in the same way as Example 1:

| | |
|---|---|
| Nickel sulfamate: | 350 g/L |
| $H_2SO_4$: | 5 g/L |
| $H_3PO_4$: | 50 g/L |
| $H_3PO_3$: | 40 g/L |
| Bath temperature: | 65° C. |
| Current density: | 15 A/dm$^2$ |
| Time: | 30 sec |
| pH: | 1.1 |

Example 4

Plating was performed by the following bath in the same way as Example 1:

| | |
|---|---|
| Nickel sulfamate: | 450 g/L |
| $H_3PO_2$: | 50 g/L |
| Temperature: | 30° C. |
| Current density: | 10 A/dm$^2$ |
| Time: | 12 sec |
| pH: | 4.0 |

Example 5

Plating was performed by the following bath in the same way as Example 1:

| | |
|---|---|
| Nickel sulfamate: | 350 g/L |
| NaH$_2$PO$_4$: | 50 g/L |
| H$_3$PO$_3$: | 120 g/L |
| Bath temperature: | 60° C. |
| Current density: | 1 A/dm$^2$ |
| Time: | 180 sec |
| pH: | 1.4 |

Comparative Example 1

In the same way as the examples, electrolytic copper foil having a thickness of 18 μm and a roughened matte surface of a roughness Rz of 2.1 μm was used to completely mask the shiny surface and mask the matte surface leaving 10×10 cm$^2$ open. As the anode, a platinum plated titanium sheet having a surface area of 1.5 dm$^2$ was used. The matte surface was plated in the following bath.

| | |
|---|---|
| NiSO$_4$.6H$_2$O: | 150 g/L |
| NiCl$_2$· 6H$_2$O: | 45 g/L |
| NiCO$_3$: | 15 g/L |
| H$_3$PO$_4$: | 50 g/L |
| H$_3$PO$_3$: | 40 g/L |
| Bath temperature: | 75° C. |
| Current density: | 5 A/dm$^2$ |
| Time: | 18 sec |
| pH: | 1.1 |

Comparative Example 2

Plating was performed by the following bath in the same way as Comparative Example 1:

| | |
|---|---|
| NiCO$_3$.2Ni(OH)$_2$· 4H$_2$O: | 210 g/L |
| H$_3$PO$_2$: | 100 g/L |
| Bath temperature: | 30° C. |
| Current density: | 5 A/dm$^2$ |
| Time: | 24 sec |
| pH: | 3.5 |

The results are shown in Table 1. In Table 1, the average thickness is the average electrodeposition of nickel (mg/dm$^2$). For the plating thickness, the surface was dissolved to obtain the amounts of deposition of nickel and phosphorus. Based on these, calibration curves were prepared by fluorescent X-rays for measurement. Accordingly, the values are for the visible surface area. Note that with nickel, 89 mg/dm$^2$ corresponds to about 1 μm. 3σ indicates the fluctuation from the average value for 10 plated sheets under various conditions at the time of measurement of N=2 (total N=20) (3σ average value).

The copper foil was etched by overlaying the plating resistance layer side of the resistance circuit board material prepared in the examples and comparative examples with epoxy-resin impregnated glass cloth, hot pressing this by a lamination press to bond them and thereby prepare a printed circuit board with a resistance layer, then etching by Shipley Neutraetch V-1 at 52° C. until the copper color is no longer visible (about 1 to 2 minutes). Further, the resistance layer was etched by 250 g/L of copper sulfate and 5 mL/L of sulfuric acid at 90° C. The unit of resistance is ohm/square.

TABLE 1

| | Example | | | | | Comp. Ex. 1 | Comp. Ex. 2 |
|---|---|---|---|---|---|---|---|
| | Ex. 1 | Ex. 2 | Ex. 3 | Ex. 4 | Ex. 5 | | |
| Uniform appearance | good | good | good | good | good | Poor | Poor |
| Average P % | 11.6 | 14.3 | 11.7 | 12.6 | 15.6 | 17.3 | 15.5 |
| Average thickness | 5.5 | 2.3 | 6.2 | 18.0 | 3.1 | 1.3 | 19.2 |
| 3σ P % | 3.0 | 4.0 | 2.0 | 3.0 | 3.0 | 13.0 | 15.0 |
| 3σ thickness | 3.0 | 4.0 | 3.0 | 1.5 | 2.0 | 11.0 | 7.0 |
| Average resistance | 50.0 | 75.0 | 53.0 | 27.0 | 80.0 | 100.0 | 25.0 |
| 3σ resistance | 3.0 | 4.0 | 3.0 | 2.0 | 5.0 | 26.0 | 18.0 |

As clear from Table 1, in the examples of the invention, the appearance was uniform. In the comparative examples, however, the appearance included stripes along the direction of flow of the plating solution. Further, fluctuations occurred in the plating thickness and became a cause of fluctuation in resistance. Further, in Comparative Example 2 with a thick plating, tortoise-shell like hairline fractures were seen through observation by an ×500 power microscope, but there were no hairline fractures and the appearance was uniform in Example 4 of the same level.

Regarding the average content of phosphorus, there was no large difference in the amount of deposition either in the examples of the invention or the comparative examples, but the fluctuation (3σ) was small in the examples of the invention or about one-quarter that of the comparative examples. From this, it was learned that the sheet resistance was constant over the entire surface. The fluctuation (3σ) of thickness of the resistance layer was much smaller compared with the comparative examples. From this point as well, it was learned that the resistance was constant over the entire surface. Therefore, Examples 1 to 5 feature small fluctuations in resistance and superior uniformity.

Summarizing the effects of the invention, as explained above, it is possible to reduce the fluctuations in appearance, plating thickness, and composition and prepare and provide products with small fluctuations in resistance.

While the invention has been described with reference to specific embodiments chosen for purpose of illustration, it should be apparent that numerous modifications could be made thereto by those skilled in the art without departing from the basic concept and scope of the invention.

What is claimed is:

1. A method for preparing a circuit board material, comprising:
    providing a plating bath comprising: nickel sulfamate at a concentration of 300 to 600 g/l; and at least one of phosphoric acid, phosphorous acid, hypophosphorous acid, and salts thereof at a concentration of phosphorus of 20 to 150 g/l;
    providing an electrode inside the plating bath;
    providing a conductive metal foil inside the plating bath to face the electrode, the conductive metal foil having a first surface and a second surface, the second surface being masked, wherein the conductive metal foil is selected from the group consisting of copper foil, aluminium foil, aluminium alloy foil, and iron alloy foil, wherein the conductive metal foil has a surface roughness Rz of not more than 2.5 μm;

applying current between the electrode and the conductive metal foil to form a thin resistance layer plated on the first surface of the conductive metal foil to prepare a circuit board material, wherein the thin resistance layer has an average electrodeposition amount of nickel of 2.3 to 18.0 mg/dm$^2$; and adhering an insulating material to the thin resistance layer formed on the first surface, and etching the conductive metal foil to make a circuit pattern.

2. A method for preparing a circuit board material according to claim 1, wherein the plating bath further comprises at least one of sulfuric acid, hydrochloric acid, and salts of the same.

3. A method for preparing a circuit board material according to claim 1, wherein the plating bath has a pH of not more than 6.

4. A method for preparing a circuit board material according to claim 1, wherein the plating bath is kept at a temperature of 30 to 80° C.

5. A method of preparing a circuit board material according to claim 1, wherein the current is applied at a current density of 1 to 30 A/dm$^2$.

6. A method of preparing a circuit board material according to claim 1, wherein the conductive metal foil has a surface roughness Rz of 1.0 μm to 2.5 μm.

7. A method for preparing a circuit board material according to claim 1, wherein the plating bath further comprises sulfuric acid or its salt.

* * * * *